(12) United States Patent
Ireland et al.

(10) Patent No.: US 6,348,411 B1
(45) Date of Patent: *Feb. 19, 2002

(54) METHOD OF MAKING A CONTACT STRUCTURE

(75) Inventors: Philip J. Ireland; Howard E. Rhodes, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,742

(22) Filed: Sep. 3, 1998

(51) Int. Cl.$^7$ ............................................. H01L 21/44
(52) U.S. Cl. ..................... 438/672; 438/629; 438/253
(58) Field of Search ............................... 438/253–256, 438/390–398, 618–681

(56) References Cited

U.S. PATENT DOCUMENTS

| | | | |
|---|---|---|---|
| 5,292,677 A | * | 3/1994 | Dennison |
| 5,338,700 A | * | 8/1994 | Dennison |
| 5,362,666 A | * | 11/1994 | Dennison |
| 5,460,690 A | | 10/1995 | Melzner .................. 156/644.1 |
| 5,468,342 A | | 11/1995 | Nulty et al. ............ 156/643.1 |
| 5,475,247 A | | 12/1995 | Kim et al. |
| 5,480,822 A | | 1/1996 | Hsue et al. .................... 437/48 |
| 5,488,011 A | | 1/1996 | Figura et al. ................. 437/60 |
| 5,652,164 A | * | 7/1997 | Dennison et al. |
| 5,966,609 A | | 10/1999 | Kwon |
| 5,973,910 A | | 10/1999 | Gardner |
| 6,165,839 A | | 12/2000 | Lee et al. .................... 438/253 |
| 6,198,143 B1 | | 3/2001 | Ohsaki ........................ 257/412 |

OTHER PUBLICATIONS

H. Itoh, et al., Two Step Deposited Rugged Surface (TDRS) Storagenode and Self Aligned Bitline–Contact Penetrating Cellplate (SABPEC) for 64MbDRAM STC Cell, Oki Electric Inductry Co., Ltd., VLSI R&D Center (Japan), pp. 9–10.

* cited by examiner

Primary Examiner—Jey Tsai
(74) Attorney, Agent, or Firm—Workman, Nydegger & Seeley

(57) ABSTRACT

A method and structure is disclosed that are advantageous for aligning a contact plug within a bit line contact corridor (BLCC) to an active area of a DRAM that utilizes a insulated sleeve structure. A lower bulk insulator layer, a capacitor dielectric layer, a cell plate conductor layer, and an upper bulk insulator layer are formed upon a semiconductor substrate. An etch removes the cell plate conductor layer, the capacitor dielectric layer, and the lower bulk insulator layer so as to form an opening terminating within the lower bulk insulator layer. A sleeve insulator layer is deposited upon the upper bulk insulator layer and within the opening. Another etch removes the sleeve insulator layer from the bottom surface within the lower bulk insulator layer. A still further etch creates a contact hole that expose a contact. The contact can be upon a transistor gate, a capacitor storage node, or an active region on the semiconductor substrate. A conductive plug is then formed in the contact hole so as to be in electrical communication with the contact. The sleeve insulator layer electrically insulates the conductive plug from the cell plate conductor layer and self aligns the BLCC so as to improve contact plug alignment tolerances between the BLCC and the capacitor components.

43 Claims, 9 Drawing Sheets

METHOD OF MAKING A CONTACT STRUCTURE

BACKGROUND OF THE INVENTION

1. The Field of the Invention

The present invention relates to the formation of a contact for an integrated circuit device on a semiconductor substrate, such as a silicon wafer. More particularly, the invention is directed to the formation of a self-aligned contact for a memory device in an integrated circuit device formed on a semiconductor material layer or substrate.

2. The Relevant Technology

As microchip technology continues to increase in complexity and decrease in component size, dimensions are shrinking to the quarter micron scale and smaller. With use of the current high-yield photolithographic techniques, the margin of error has become increasingly tighter such that a single misaligned fabrication step can cause an entire chip to be flawed and be discarded. As devices shrink further, overstepping each process step's window of error increases the likelihood of fabrication failure. A production worthy device feature requires incidental skill of a process engineer and a fabrication operator to fabricate the feature.

One device that is subject to the ever-increasing pressure to miniaturize is the dynamic random access memory (DRAM). DRAMs comprise arrays of memory cells which contain two basic components—a field effect access transistor and a capacitor. Typically, one side of the transistor is connected to one side of the capacitor. The other side of the transistor and the transistor gate electrode are connected to external connection lines called a bit line and a word line, respectively. The other side of the capacitor is connected to a reference voltage. Therefore, the formation of the DRAM memory cell comprises the formation of a transistor, a capacitor and contacts to external circuits.

It is advantageous to form integrated circuits with smaller individual elements so that as many elements as possible may be formed in a single chip. In this way, electronic equipment becomes smaller, assembly and packaging costs are minimized, and integrated circuit performance is improved. The capacitor is usually the largest element of the integrated circuit chip. Consequently, the development of smaller DRAMs focuses to a large extend on the capacitor. Three basic types of capacitors are used in DRAMs—planar capacitors, trench capacitors, and stacked capacitors. Most large capacity DRAMs use stacked capacitors because of their greater capacitance, reliability, and ease of formation. For stacked capacitors, the side of the capacitor connected to the transistor is commonly referred to as the "storage node", and the side of the capacitor connected to the reference voltage is called the cell plate. The cell plate is a layer that covers the entire top array of all the substrate-connected devices, while there is an individual storage node for each respective storage bit site.

The areas in a DRAM to which an electrical connection is made are the gate of a transistor of the DRAM, a contact plug to an active area, and the active area itself. Active areas, which serve as source and drain regions for transistors, are discrete specially doped regions in the surface of the silicon substrate. A bit line contact corridor (BLCC) is created in order to make electrical connection to an active area. The BLCC is an opening created through the insulating material separating the bit line and the active area. The BLCCs are filled with a conductive material, such as doped polysilicon, doped Al, AlSiCu, or Ti/TiN/W. Before filling the BLCC, however, a process engineer must design a process flow for fabricating the BLCC that assures that the BLCC is not misaligned, and therefore not prone to shorting out or subject to errant charge leaking due to an exposed cell plate in the BLCC.

Conventional methods of fabricating bit line contacts may tend to cause shorting of the bit line contact in the BLCC into the cell plate due to misalignment. For example, titanium is conventionally sputtered into a BLCC. Next, titanium nitride is deposited by CVD or PVD processing. A rapid thermal anneal step (RTA) then causes silicide formation. Tungsten is then deposited to fill the remaining opening in the BLCC. Depending upon the accuracy in the formation of the BLCC itself, it is possible for the BLCC to be shorted to other conducting layers. This is described below. In general, the BLCC can also be composed of tungsten, titanium/tungsten, aluminum, copper, a refractory metal silicide with aluminum, and a refractory metal silicide with copper.

As the size of the DRAM is reduced, the size of the active areas and the BLCCs available for contacts to reach the active areas are also reduced. Every process step has its own alignment limitations. While alignment is not exact between process steps, strict tolerances are required in order to accomplish a corridor that avoids a short between a contact that will be deposited in the BLCC and any other conductive materials (i.e. cell plate to active area). Hence, it is desirable to effectively isolate the contacts from the transistor and capacitor components while optimizing the space available to make the contacts.

The conventional methods of forming contacts between bit lines and an active areas experience alignment problems in avoiding a short circuit between the electrically conductive bit line contact and the cell plate or storage node of a capacitor.

SUMMARY OF THE INVENTION

A method and structure is disclosed that are advantageous for preventing shorting of a contact to an active area with a capacitor cell plate and a capacitor storage node. In accordance with one aspect of the invention, a method of fabricating a DRAM is disclosed that utilizes an insulated sleeve structure to self-align a bit line contact corridor (BLCC) to an active area of a DRAM transistor. In accordance with this aspect of the invention, capacitors are formed over a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

In the inventive method, a lower bulk insulator layer is formed upon the semiconductor substrate, and a dielectric layer is formed upon the lower bulk insulator layer. Next, a conductor layer is formed upon the dielectric layer and an upper bulk insulator layer is formed upon the conductor layer. An etch is performed to selectively remove the conductor layer, the dielectric layer, and the lower bulk insulator layer so as to form an opening defined by the lower bulk insulator layer, the dielectric layer, and the conductor layer. The opening terminates at a bottom surface within the lower bulk insulator layer above the semiconductor substrate.

Next, a sleeve insulator layer is deposited upon the upper bulk insulator layer and within the opening so as to make contact with each of the lower bulk insulator layer, the dielectric layer, and the conductor layer. An etch process is then performed to substantially remove the sleeve insulator layer from the bottom surface within the lower bulk insulator layer above the semiconductor substrate, and from on top of the insulator layer, thus leaving the sleeve insulator layer in contact with each of the lower bulk insulator layer, the dielectric layer, and the conductor layer.

Another etch process then selectively removes the lower bulk insulator layer to create a contact hole defined by the sleeve insulator layer and the lower bulk insulator layer and to expose a contact on the semiconductor substrate. A conductive plug is then formed in the contact hole upon the contact on the semiconductor substrate such that the sleeve insulator layer electrically insulates the conductive plug from the conductor layer.

The sleeve insulator layer, which self aligns the BLCC, allows for improved alignment tolerances between the BLCC and other layers, thus preventing errant charge leakage and short circuits between the conductive plug formed within the BLCC and the other layers.

Conceptually, the etching of the BLCC progressively deeper into the lower bulk insulator layer can be carried out incrementally with a plurality of depositions of the material of the sleeve insulator layer, each said deposition being followed by an etch of the sleeve insulator layer to remove the same from the bottom of the BLCC within the lower bulk insulator layer.

BRIEF DESCRIPTION OF THE DRAWINGS

A more particular description of the invention briefly described above will be rendered by reference to specific embodiments thereof which are illustrated in the appended drawings. Understanding that these drawings depict only typical embodiments of the invention and are not therefore considered to be limiting of its scope, the invention will be described and explained with additional specificity and detail through the use of the accompanying drawings in which.

DETAILED DESCRIPTION OF THE PREFERRED EMBODIMENTS

The present invention will be described in terms of complementary metal oxide semiconductor (CMOS) technology. CMOS is commonly used in integrated circuit technology. The invention, however, may be used in other integrated circuit technologies. CMOS generally refers to an integrated circuit in which both N-channel and P-channel metal oxide semiconductor field effect transistors (MOSFETs) are used in a complementary fashion. CMOS integrated circuits are typically formed with a lightly doped P-type silicon substrate or a lightly doped N-type silicon substrate. The present invention will be described using lightly doped P-type silicon as the starting material, although the invention may be implemented with other substrate materials. If other substrate materials are used, then there may be corresponding differences in materials and structures of the device as is well known in the art.

The formation of integrated circuits includes photolithographic masking and etching. This process consists of creating a photolithographic mask containing the pattern of the component to be formed, and coating the semiconductor substrate with a light-sensitive material called photoresist. The photoresist that coats semiconductor substrate is then exposed to ultra-violet light or to standard I-line processing through the mask to soften or harden parts of the photoresist (depending on whether positive or negative photoresist is used). The softened parts of the photoresist are then removed, which is followed by etching to remove the materials left unprotected by the photoresist, and then stripping the remaining photoresist. This photolithographic masking and etching process is referred to herein as patterning and etching.

In the following discussion, some well-known aspects of DRAM fabrication have been simplified. For example, the structure of the doped source/drain regions generally will be more complex than shown. In addition, the particular materials, structures and processes are intended only to illustrate the invention so that it can be fully understood.

Figure 1:
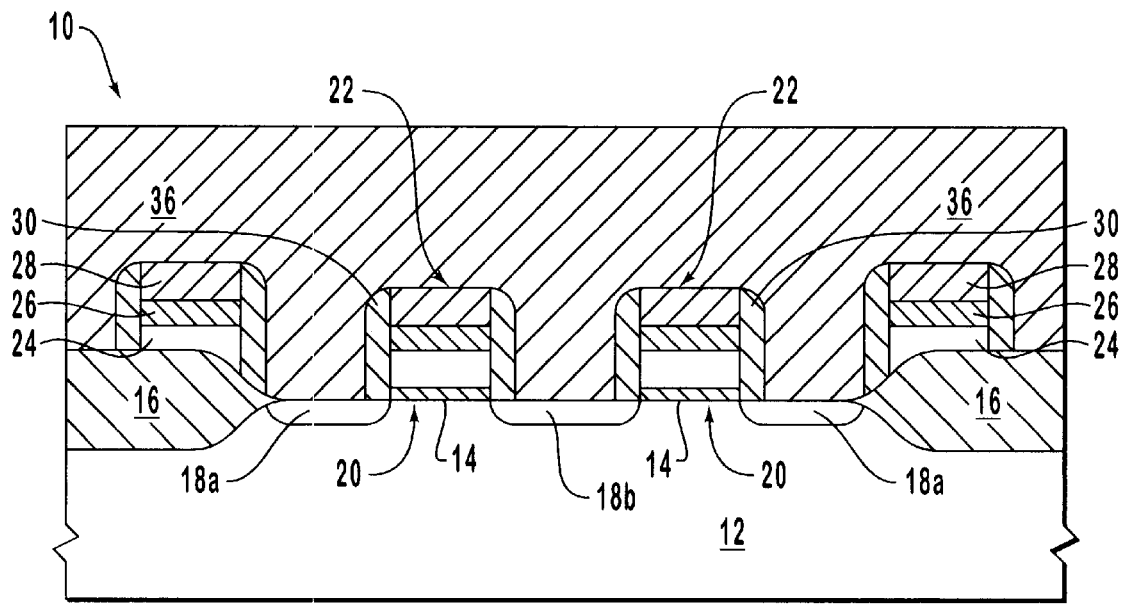
FIGS. 1–5 are cross section views of a DRAM memory cell undergoing fabrication according to a first embodiment of the present invention.

An embodiment of the invention will now be described with reference to FIGS. 1–9. Referring to FIG. 1, a semiconductor substrate 10 comprises a silicon substrate 12 with a gate insulating layer 14, field oxide regions 16, active or source/drain regions 18a and 18b, and access transistors 20. Each access transistor 20 has a gate electrode 24, insulating protective layer 28, and insulating spacers 30 that are formed on the sides thereof. A lower bulk insulator layer 36 is then deposited and if necessary, planarized. Lower bulk insulator layer 36 is preferably made of a dielectric material such as borophosphosilicate glass (BPSG), phosphosilicate glass (PSG), borosilicate glass (BSG), or spin on glass (SOG).

Figure 2:
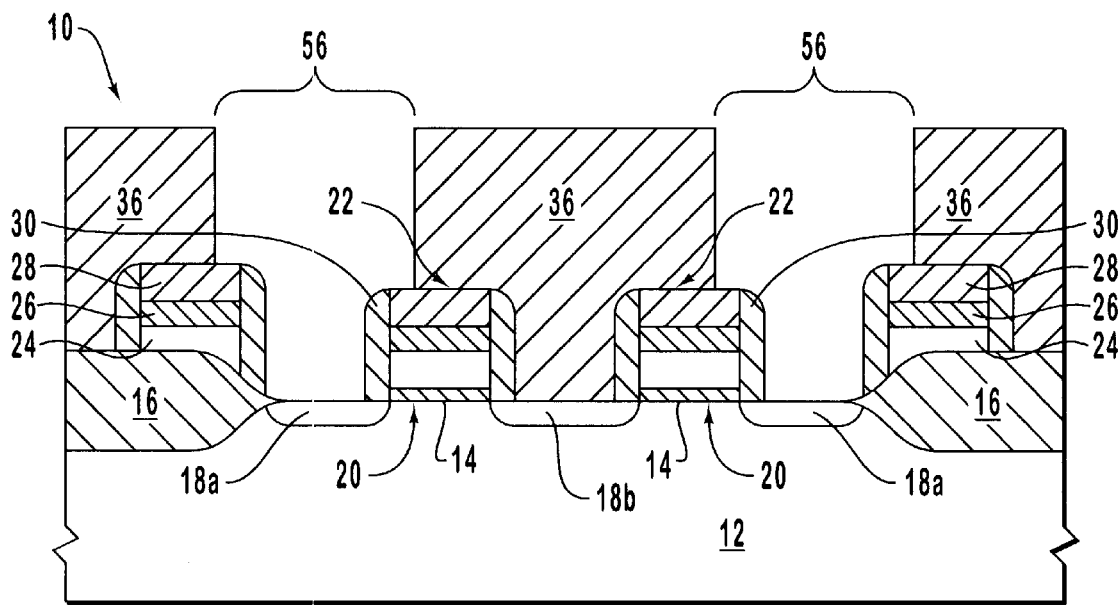

Referring to FIG. 2, lower bulk insulator layer 36 is patterned and etched to define a volume 56 in which a capacitor is to be formed in lower bulk insulator layer 36. Volume exposes portions of substrate 12 at source/drain regions 18a.

Figure 3:
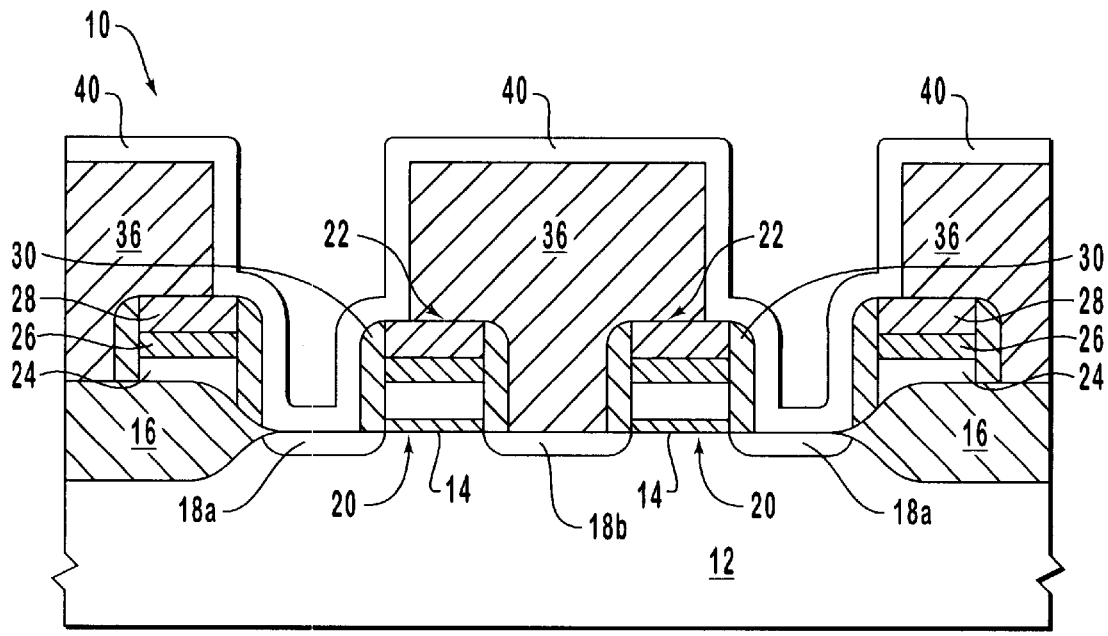
Figure 4:
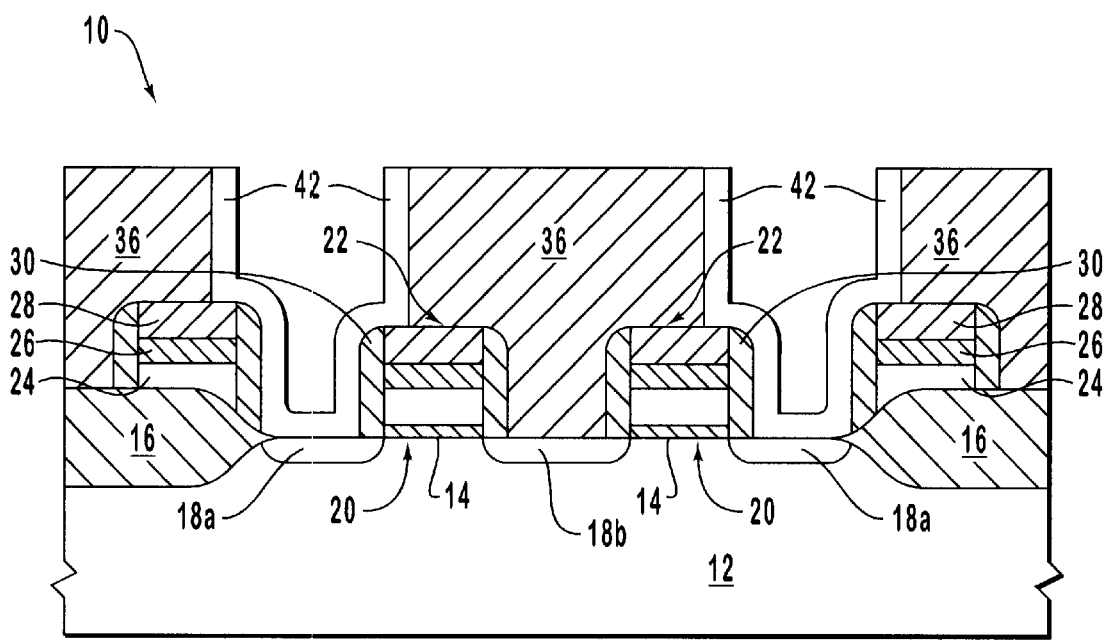

Referring to FIG. 3, a storage plate 40 is deposited. Storage plate 40, which is substantially composed of an electrically conductive material, is preferably composed of doped polysilicon or doped rough textured polysilicon. Referring to FIG. 4, storage plate 40 has been subjected to an planarizing process, such as chemical mechanical polishing, to form a storage node layer 42.

Figure 5:
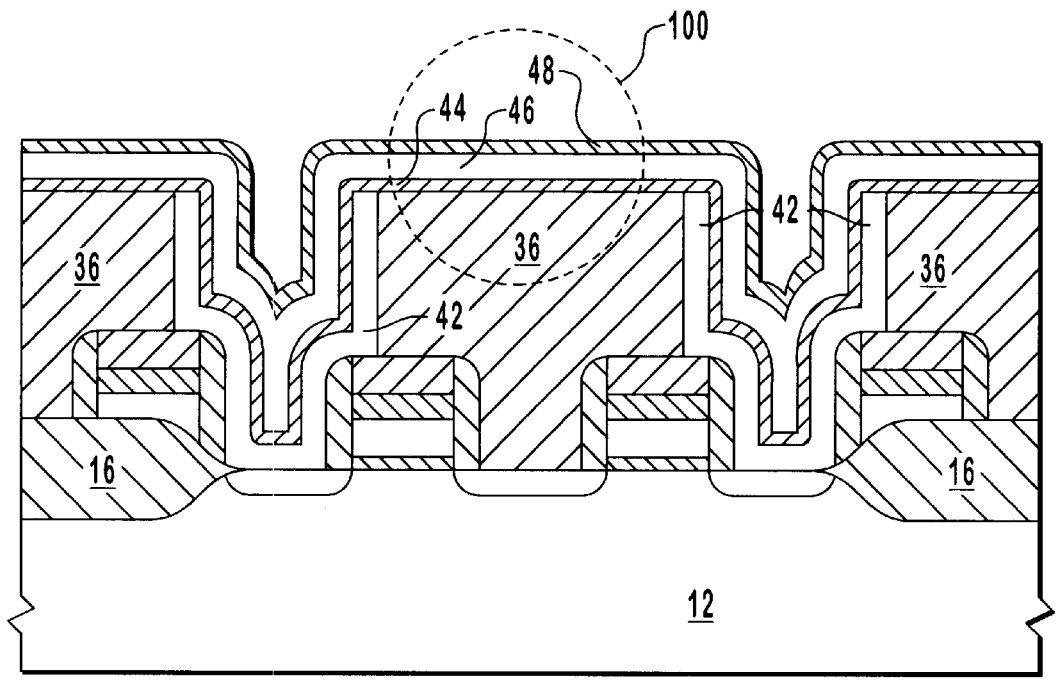

Referring to FIG. 5, a capacitor cell dielectric layer 44 is deposited. Capacitor cell dielectric layer 44, which intended to form a portion of dielectric material for a capacitor, is preferably made of $Si_3N_4$ or other electrically insulative suitable material such as $Ta_2O_5$, or barium strontium titanate (BST). A cell plate layer 46 is then deposited. Cell plate layer 46 is intended to form a cell plate portion of a capacitor in an integrated circuit.

A cell plate insulating layer 48 is deposited over cell plate layer 46 so as to electrically insulate portions of cell plate layer 46. Cell plate insulating layer 48 is preferably substantially composed of $Si_3N_4$, but may also be substantially composed of silicon dioxide or other suitable electrically insulative materials. Preferably, etching processing, which may follow in the process flow, will be selective to the materials of which capacitor cell plate insulating layer 48 is composed. As such, cell plate insulating layer 48 need not necessarily be composed of silicon nitride, but can be composed of another dielectric that resists a BPSG etch or a dielectric etch that is selective to lower bulk insulator layer 36.

Figure 6:
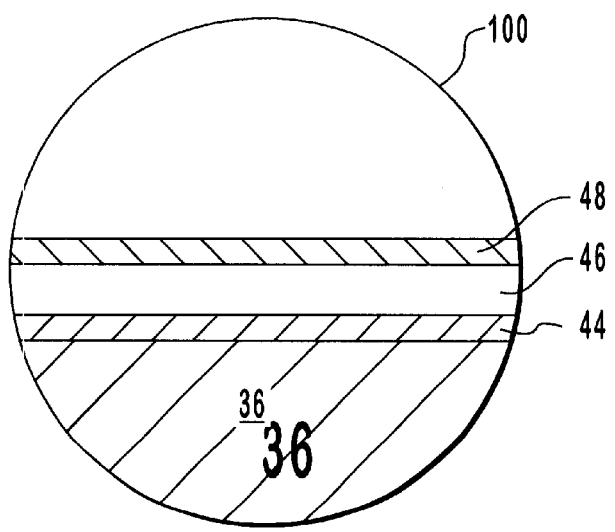
FIGS. 6–9 illustrate a selected portion of FIG. 5 as it is subjected to fabrication according to the embodiment of the present invention.

The method of forming a first preferred embodiment of the present invention is set forth below and illustrated in FIGS. 6–11. FIG. 6 is a section 100 taken from FIG. 5 and expanded to illustrate greater detail. Referring to FIG. 6, there is illustrated lower bulk insulator layer 36, capacitor cell dielectric layer 44, cell plate layer 46, and cell plate insulating layer 48 which is deposited over cell plate layer 46.

Figure 7:
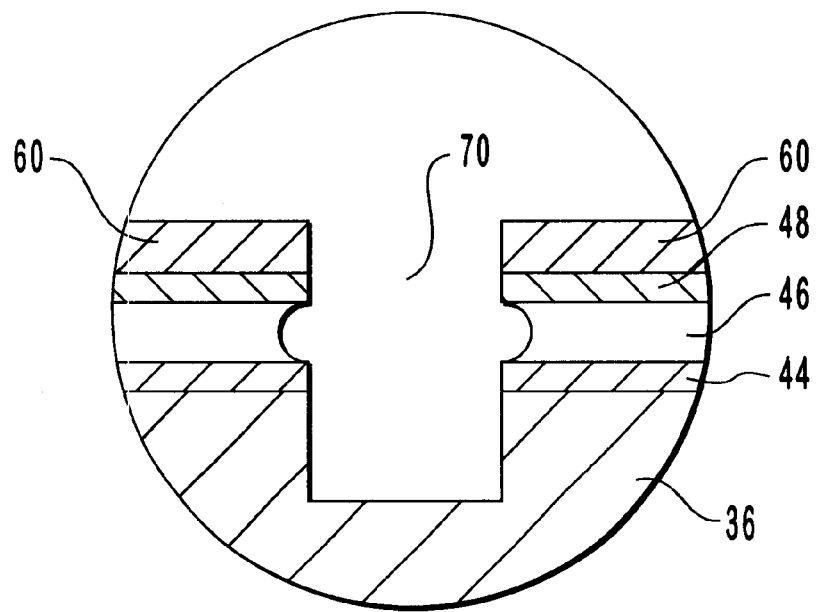
Figure 11:
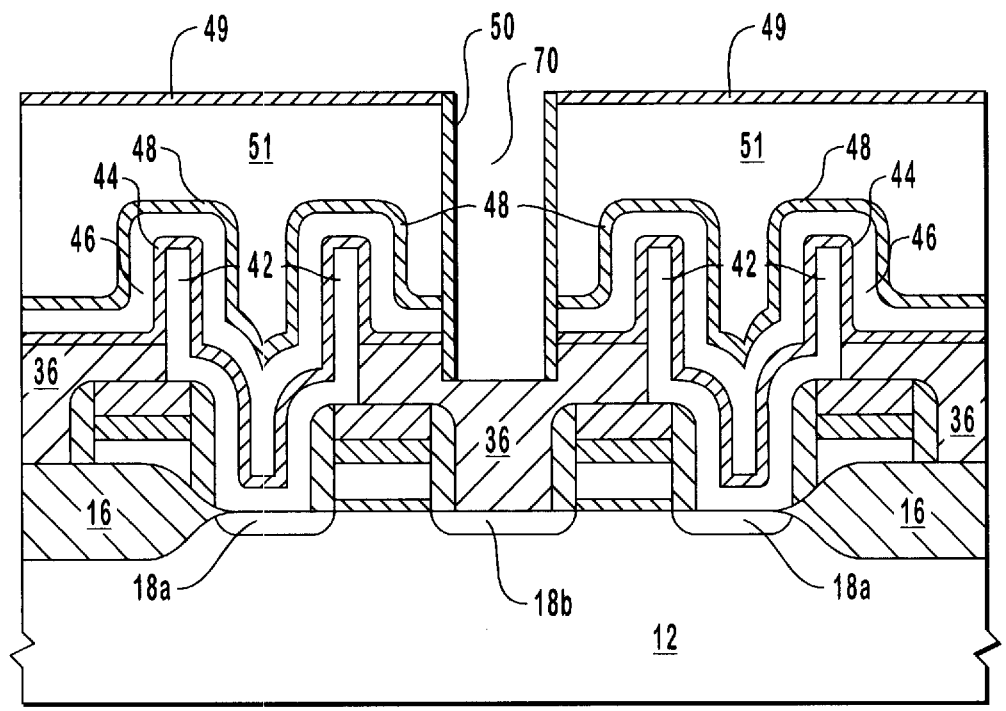

Referring to FIG. 7, there is illustrated a first etch step wherein a photoresist layer 60 is spun on, exposed, and selectively removed during development to expose a preferred bit line contact site. The first etches step etching cell plate layer 46 and may involve the use of an isotropic component, resulting in an undercut into capacitor cell dielectric layer 44. The first etch step penetrates the noted conductive and insulative layers and partially penetrates into lower bulk insulator layer 36. The first step, however, will preferably be anisotropic so as to form a contact hole 70 with no undercut into cell plate layer 46 or less than is illustrated in FIG. 7. Similar to that which is illustrated in FIG. 11 as an anisotropic etch extending through layers 36, 44, 46, and 48, it is preferable that an anisotropic etch be performed through layers 36, 44, 46, and 48 seen in FIG. 7 so as to form straight side walls of the etched contact hole 70. The etch process through layers 36, 44, 46, and 48 seen in FIG. 7, however, can performed so as to have an isotropic component so as to leave contact hole 70 without straight side walls, although such an isotropic etch is not preferred.

Figure 8:
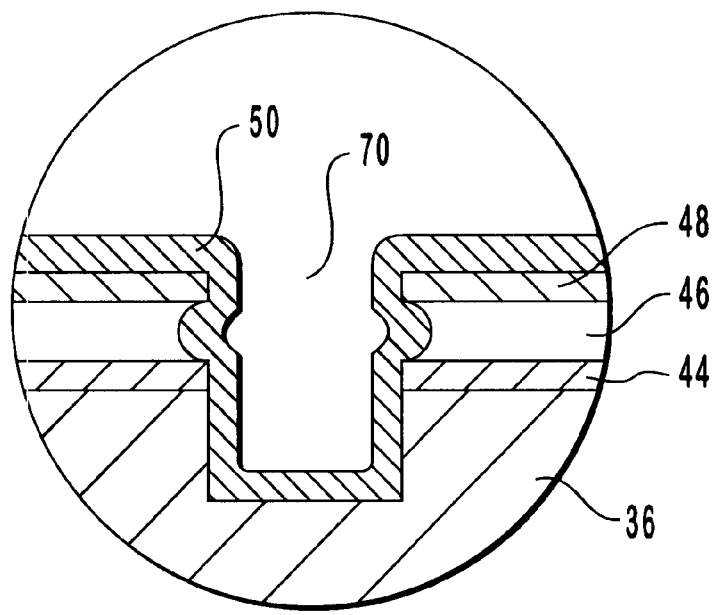

Referring to FIG. 8, the next step of the present invention method is carried out in which the remaining portions photoresist layer 60 have been removed, and then a sleeve insulator layer 50 is deposited upon the uppermost surface of cell plate insulating layer 48 and also within the BLCC. An ambient pressure chemical vapor deposition (CVD) process can be used to assist in lateral deposition of sleeve insulator layer 50 upon the sidewalls of the BLCC. Other methods, however, can be employed which are calculated to achieve suitably conformal depositions. A preferred CVD substance for sleeve insulator layer 50 is $Si_3N_4$, $SiO_2$ (by decomposition of a tetraethylorthosilicate precursor), $Ta_2O_5$, or barium strontium titanate (BST), although the etchant used to etch lower bulk insulator layer 36 should be selective to the substance of sleeve insulator layer 50.

Figure 9:
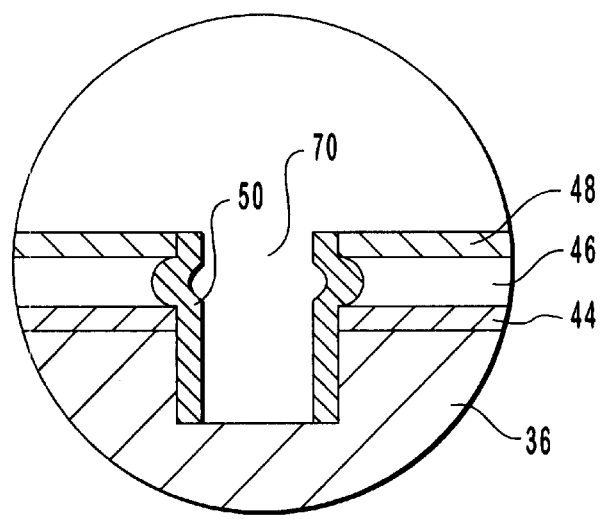

Referring to FIG. 9, a second etch step, which is anisotropic, is carried out to remove substantially all of the horizontally-exposed portions of sleeve insulator layer 50 from the bottom of the partially formed BLCC. Sleeve insulator layer 50 thus covers the exposed portions of capacitor cell dielectric layer 44, cell plate layer 46, and cell plate insulating layer 48 that are within contact hole 70.

The structure represented in FIG. 9 illustrates a first embodiment of the present invention wherein sleeve insulator layer 50 is formed into a hardened vertical sleeve and cell plate insulating layer 48 is formed into a horizontal plate. As such, sleeve insulator layer 50, with cell plate insulating layer 48 function as a self-aligning contact site that will resist being removed in a subsequent etch step that etches the remainder of lower bulk insulator layer 36. Such an etch of lower bulk insulator layer 36 will form a conduit from the upper surface of cell plate insulating layer 48 to the upper surface of the semiconductor substrate, and will not expose cell plate layer 46 at the edges of the BLCC. Sleeve insulator layer 50 will thereby insulate cell plate layer 46 from the effects of errant charge leakage and from shorting once the BLCC is filled with conductive material and put into service as a bit line contact. The embodiment of the invention seen in FIG. 9 is not limited to bit line contact formation, but can be used where self aligned contacts are desirable, such as contacts to an active region, a transistor gate, or to a contact plug.

Figure 10:
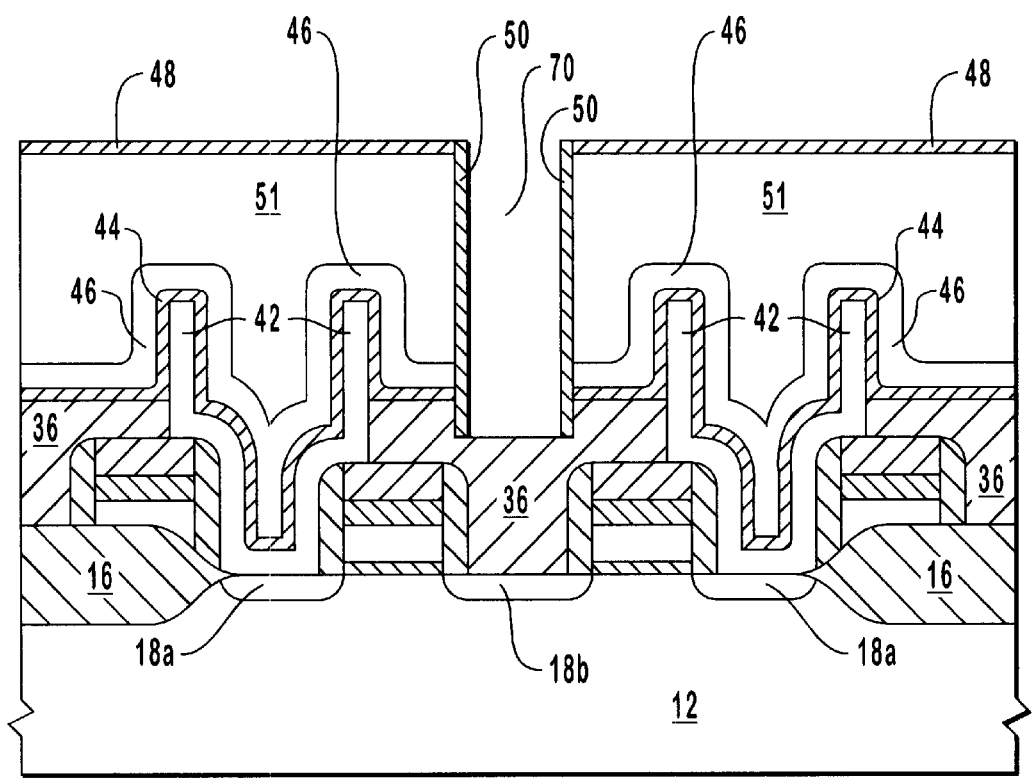
FIGS. 10 and 11 illustrate second and third embodiments of the present invention, taking a similar selected portion as from FIG. 5, wherein the cell plate has a larger surface area around the storage node.

FIG. 10 illustrates an example of a second embodiment of the present invention. Cell plate layer 46 maximizes its capacitative effect upon storage node layer 42 by its being wrapped conformally around two opposing vertical faces of storage node layer 42. In this embodiment, the cell-to-cell bridging of cell plate layer 46 is deeper in the structure. A primary insulator layer 48 is deposited upon a upper bulk insulator layer 51. Then, a partial etch is made through primary insulator layer 48 into upper bulk insulator layer 51 and stopping within a lower bulk insulator layer 36 so as to form a contact hole 70. A secondary sleeve insulator layer 50 is then deposited upon primary insulator layer 48 and within contact hole 70. An anisotropic etch removes secondary sleeve insulator layer 50 from the bottom of contact hole 70 and other laterally exposed portions thereof. The anisotropic etch stops on insulator layer 48, leaving secondary sleeve insulator layer 50 as a liner on the sidewalls of contact hole 70. A subsequent openings contact to active region 18B and a contact plug is formed through secondary sleeve insulator layer 50 and in contact with active region 18b.

FIG. 11 illustrates a third embodiment of the present invention in which a cell plate structure is like the second embodiment, but also has a cell plate insulating layer 48 disposed on top of cell plate layer 46. The upper surface of cell plate layer 46 is partially insulated by cell plate insulating layer 48. This third embodiment may be preferred where a neighboring site requires cell plate insulating layer 48, such as where cell plate insulating layer 48 is useful or convenient so as to avoid masking for deposition of cell plate insulating layer 48. Cell plate insulating layer 48 should be composed of a material different from capacitor cell dielectric layer 44 so as to best facilitate the partial etch into lower bulk insulator layer 36. A primary insulator layer 49 is deposited a upper bulk insulator layer 51. Then, a partial etch is made through primary insulator layer 49 into upper bulk insulator layer 51 and stopping within a lower bulk insulator layer 36 so as to form a contact hole 70. A secondary sleeve insulator layer 50 is then deposited upon primary insulator layer 49 and within contact hole 70. An anisotropic etch removes secondary sleeve insulator layer 50 from the bottom of contact hole 70 and other laterally exposed portions thereof. The anisotropic etch stops on primary insulator layer 49, leaving secondary sleeve insulator layer 50 as a liner on the sidewalls of contact hole 70.

A subsequent etch can be performed upon each of the structures seen in FIGS. 10 and 11 so as to open a contact to active area 18b on silicon substrate 12 through contact hole 70. A conductive plug (not shown) is then formed within contact hole 70 upon active area 18b on silicon substrate 12 so as to be electrically insulated from cell plate layer 46 by sleeve insulator layer 50.

Figure 12:
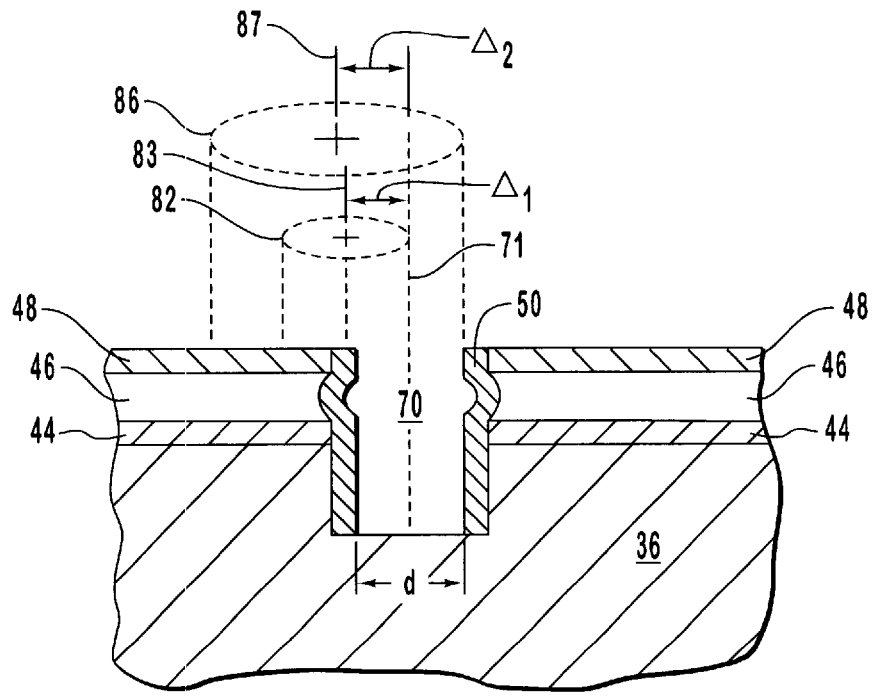
FIGS. 12–16 illustrate the first embodiment of the present invention and the accomplished structure's protective effect against shortages despite a misaligned mask and etch.
Figure 13:
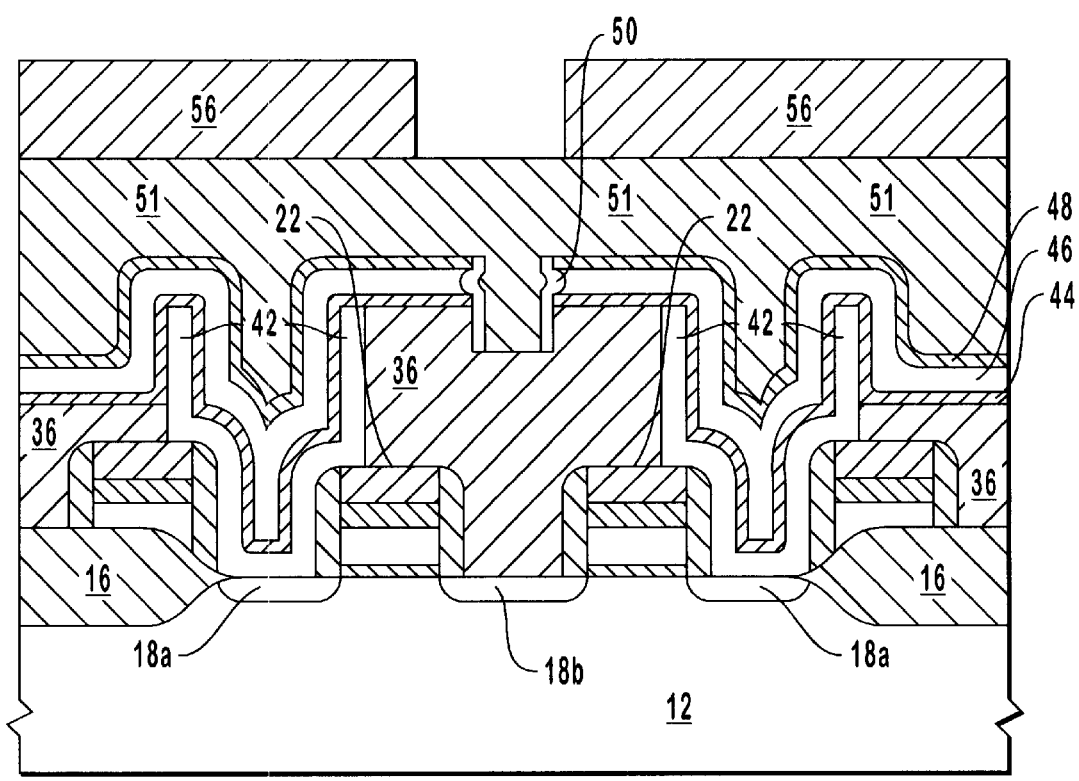
Figure 14:
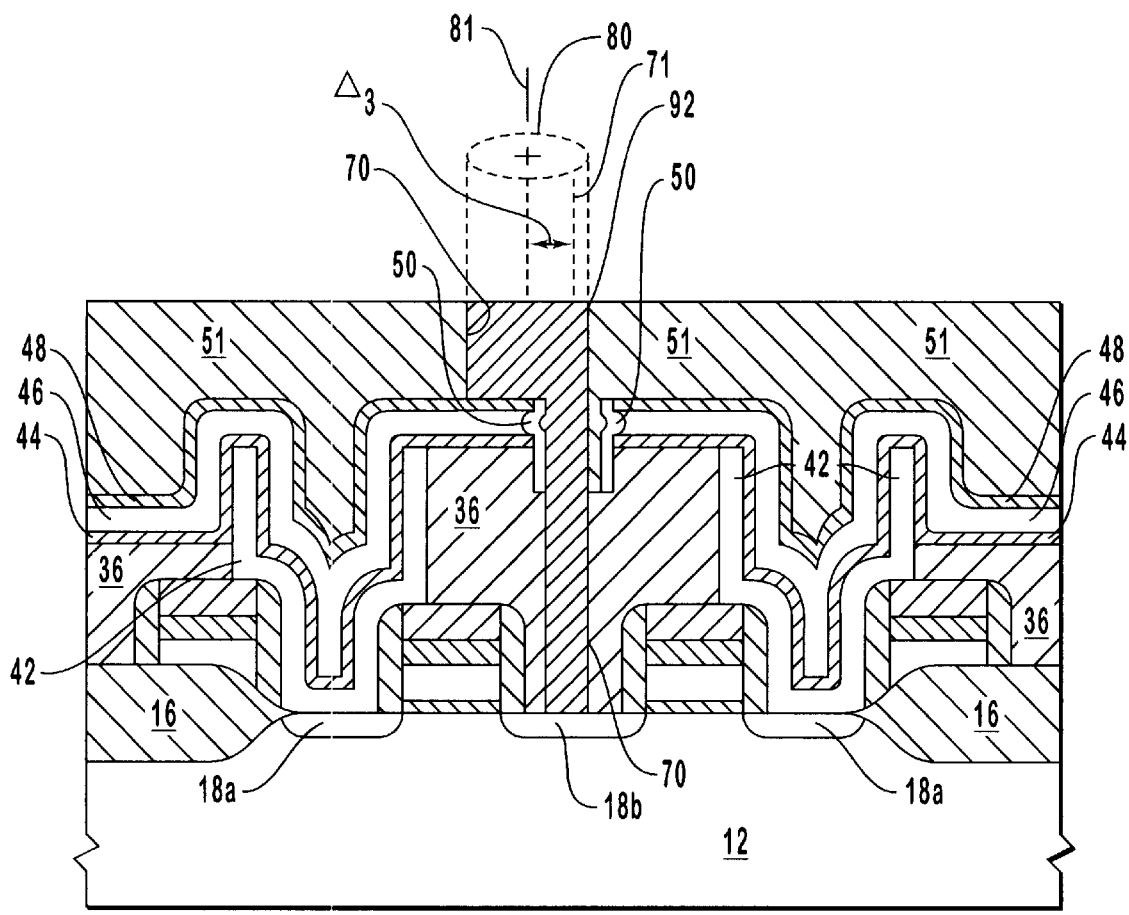

FIGS. 12–14 illustrate the function of the first embodiment of the present invention as it provides a self-aligning contact hole site for further processing. Referring to FIGS. 12–14, there are illustrated qualitative process flow examples of which both proper alignment and misalignment in the formation of a contact plug in a contact hole. The misalignment example is set forth to illustrate the self alignment feature of the invention.

FIG. 12 shows large and small off-set alignment circles 82, 86 which are meant to indicate an etching process through a layer of insulation material (not shown) above cell plate insulating layer 48 so as to form contact hole 70 defined within sleeve insulator layer 50. A center line 83 represents the axis through the center of small off-set alignment circle 82, and a center line 87 represents the axis through the center of large off-set alignment circle 82, and a center line 87 represents the axis through the center of large off-set alignment circle 86. As seen in FIG. 12, center line 83 and center line 87 are off set one from the other. A center line 71 represents the axis defining the of contact hole 70.

Small off-set alignment circle 82 shows a misalignment distance $\Delta_1$ from center line 83 to center line 71. Large off-set alignment circle 86 shows a misalignment distance $\Delta_2$ from center line 87 to center line 71. The self alignment of the etch process to form contact hole 70 is due to the selectivity of the etchant in the etch process to both sleeve insulator layer 50 and cell plate insulating layer 48 as the etch process etches lower bulk insulator layer 36 which defined the termination of contact hole 70.

FIG. 13 shows that an upper bulk insulator layer 51 is deposited within the area defined by sleeve insulator layer 50 and upon cell plate insulating layer 48. A patterned photoresist layer 56 has been formed upon upper bulk insulator layer 51. The pattern in patterned photoresist layer 56 is intended to be aligned with respect to sleeve insulator layer 50 so that a subsequent etch will open a contact through upper bulk insulator layer 51 and lower bulk insulator layer 36 to expose a contact on active area 18b. Patterned photoresist layer 56, however, maybe misaligned with respect to sleeve insulator layer 50, as was illustrated by the foregoing discussion of FIG. 12.

Figure 15:
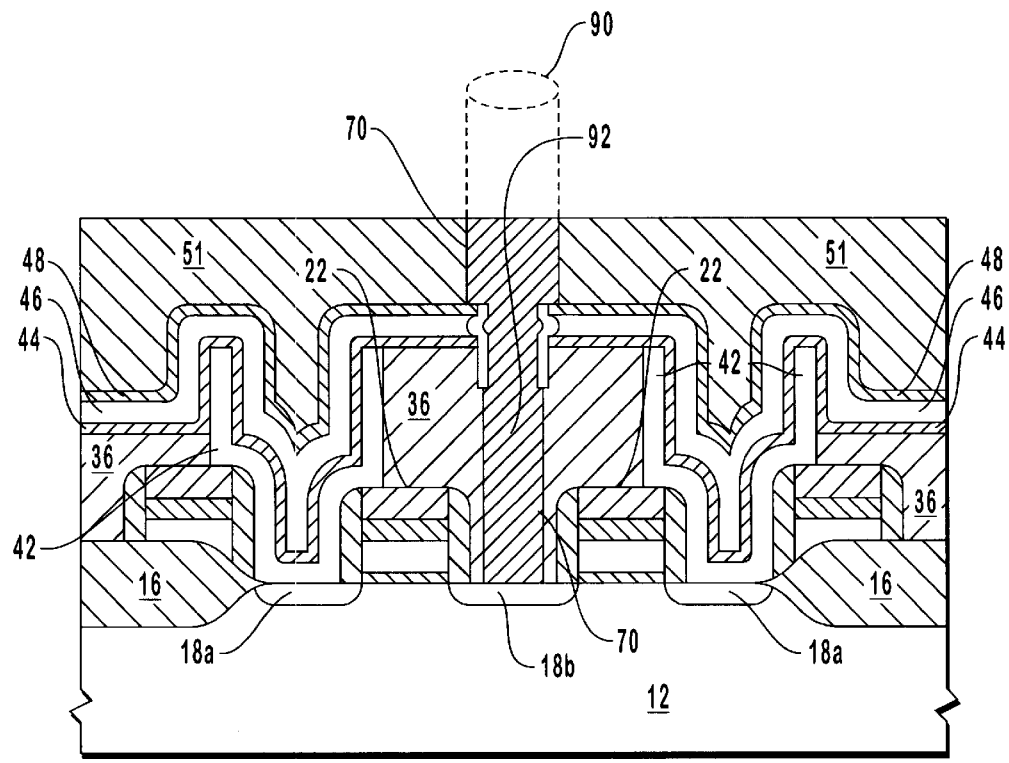

The etch through patterned photoresist layer 56 forms the BLCC via contact hole 70 seen in FIGS. 14–15. It is desirable that contact hole 70, which extends to active area 18b through sleeve insulator layer 50, is formed such that the BLCC is in alignment with contact hole 70 through cell plate layer 46. When so aligned, the etch has a diameter d seen in FIG. 12 which extends to the sidewall of sleeve insulator layer 50, and the largest possible contact to active area 18b is achieved. Sleeve insulator layer 50 enables the inventive method to form sub-photolithography resolution limit critical dimensions, such as is seen in FIG. 12.

Referring to FIG. 14, a circle 80 illustrates in phantom a cross-section of an etch hole through upper bulk insulator layer 51. A center line 81 represents an axis passing through the center of circle 80. In FIG. 14, center line 71 represents the axis passing through the center of sleeve insulator layer 50. The symbol $\Delta_3$ represent the misalignment from the center of circle 80 to the center of sleeve insulator layer 50.

FIG. 14 demonstrates that, although the etch hole is misaligned with respect to sleeve insulator layer 50, the etch is still self aligned with sleeve insulator layer 50 due to the selectivity of the etch with respect to the material from which sleeve insulator layer 50 is composed and due to the etch selectivity to the material of which cell plate insulating layer 48 is composed. The self-alignment of the etch through sleeve insulator layer 50 and the stopping of the etch on cell plate insulating layer 48 in effect assures an electrical insulation of cell plate layer 46 that prevents an electrical short with an electrically conductive bit line contact 92 within the BLCC. Bit line contact 92, which is preferably a conductive plug, can be formed by filling the BLCC with tungsten deposited, by chemical vapor deposition, with germanium-doped aluminum reflowing, and with other materials and processes. Additionally, a refractory metal silicide may be formed at the bottom of the BLCC upon active area 18b. After the material forming bit line contact 92 has been formed within contact hole 70, a planarizing operation may be conducted to confine the material of bit line contact 92 within contact hole 70 as illustrated in FIGS. 14–15.

Bit line contact 92 extends through contact hole 70 created by the prior etch process to make direct contact with active area 18b. FIG. 14 illustrates that, although the maximum contact size is not achieved when the etch is misaligned, electrical insulation protection is still provided by cell plate insulating layer 48 and sleeve insulator layer 50 so as to prevent shorting of cell plate layer 46 with bit line contact 92.

The process creating the structure seen in FIG. 14 is substantially the same as that creating the structure seen in FIG. 15. In FIG. 15, a circle 90 illustrates in phantom a cross-section of an etch hole through upper bulk insulator layer 51. The etch hole is aligned with respect to sleeve insulator layer 50. Also, the etch is self aligned with sleeve insulator layer 50 due to the selectivity of the etch with respect to the material from which sleeve insulator layer 50 is substantially composed, and due to the etch selectivity to the material of which cell plate insulating layer 48 is composed. As was described with respect to FIG. 13, the self-alignment of the etch through sleeve insulator layer 50 in effect assures electrical insulation of cell plate layer 46 to prevent an electrical short with electrically conductive bit line contact 92 within the BLCC. FIG. 15 illustrates the maximum contact size on active area 18b, as dictated by the diameter of the area defined within sleeve insulator layer 50. Electrical insulation protection of bit line contact 92 is provided by cell plate insulating layer 48 and sleeve insulator layer 50 so as to prevent shorting of cell plate layer 46 with bit line contact 92.

Figure 16:
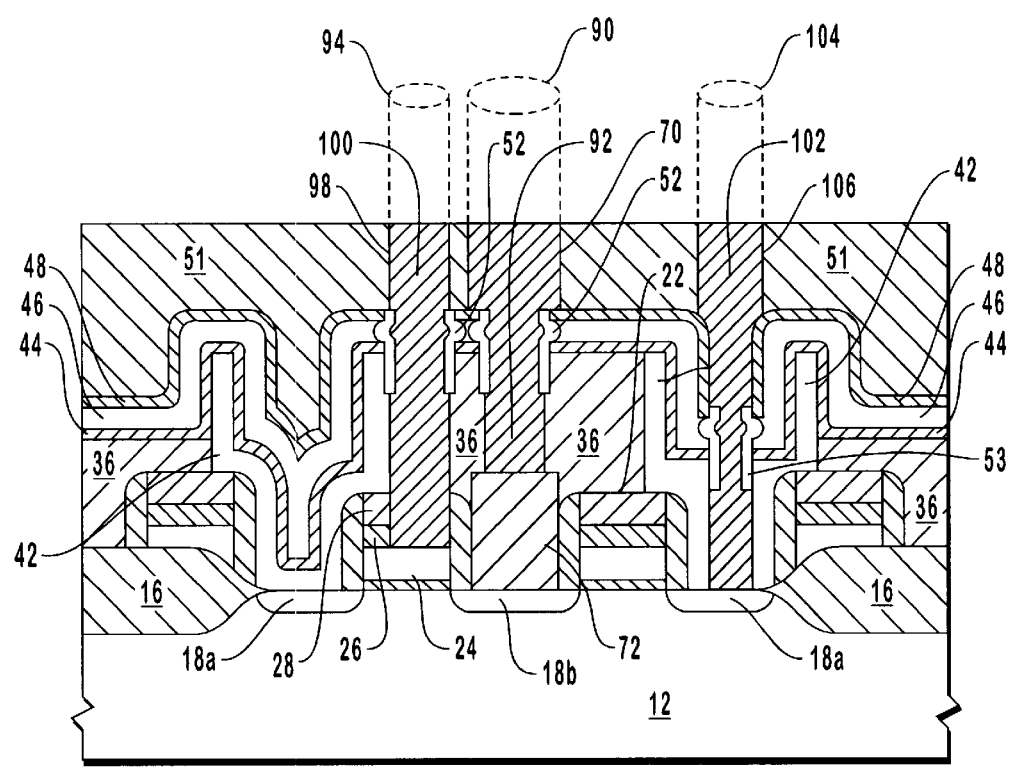

FIG. 16 shows the divergent types of contacts that can be made using the invention, although all of the depicted contacts need not be present in the same structure nor be situated as depicted in FIG. 16. In FIG. 16, circle 90 illustrates in phantom a cross-section of an etch hole, made by conventional etch processes, through upper bulk insulator layer 51. A contact plug 72 in upon source/drain region 18b. Electrically conductive bit line 8 contact 92 is situated within contact hole 70 and passes through sleeve insulator layer 50 to terminate upon contact plug 72. Circle 94 illustrates in phantom a cross-section of a contact hole 98, made by conventional etch processes, through upper bulk insulator layer 51 and into a transistor so as to stop on a gate electrode 24 beneath an insulating protective layer 28 of a transistor. Electrically conductive contact 100 is situated within contact hole 98 and passes through a sleeve insulator layer 52 to make contact with gate electrode 24. Circle 104 illustrates in phantom a cross-section of a contact hole 106, made by conventional etch processes, through upper bulk insulator layer 51 and into storage node layer 42. Electrically conductive contact 102 is situated within contact hole 106 and passes through a sleeve insulator layer 53 to make contact with storage node layer 42. Sleeve insulator layer 53 insulates electrically conductive contact 102 from cell plate layer 46.

The fabrication method steps of the self-aligning feature, which are illustrated in FIGS. 1–9 and described above, constitute a fourth embodiment of the present invention.

A fifth and sixth embodiment of the present invention, illustrated respectively in FIGS. 10 and 11, comprises a larger surface area deposition of cell plate layer 46 that requires a deeper penetrating partial etch to create the self-aligning feature. These embodiments vary from the fourth embodiment in that a selective etch step is required to remove most of lower bulk insulator layer 36 so as to expose external lateral surfaces of cell plate layer 46. In the fifth embodiment, seen in FIG. 10, upper bulk insulator layer 51 is deposited and planarized and then a sleeve insulator layer 50 is deposited upon upper bulk insulator layer 51 and within contact hole 70. As was discussed above, a conductive plug (not shown) is formed within contact hole 70 once an etch exposes active area 18b. The conductive plug is electrically insulated from cell plate layer 46 by sleeve insulator layer 50 and could also be so insulated by primary insulator layer 48. The sixth embodiment, seen in FIG. 11, differs from the fifth embodiment, seen in FIG. 10, in that a cell plate insulating layer 48 is over cell plate layer 46 for off-site coverage where it is useful or not convenient to mask out deposition upon cell plate layer 46.

Other materials, structures, and processes may be substituted for the particular ones described. For example, silicon nitride, preferably $Si_3N_4$, may be used instead of silicon dioxide for insulating protective layer 28 and spacers 30. Spin-On Glass (SOG), polyamide insulator (PI), chemical vapor deposited (CVD) oxide or other insulators such as boron silicate glass (BSG) or phosphosilicate glass (PSG) may be used in place of boro-phospho-silicate glass (BPSG) for lower bulk insulator layer 36. Other satisfactory materials may be substituted for any of the above. Or, additional materials, structures, and processes may also be added to those disclosed.

The present invention may be embodied in other specific forms without departing from its spirit or essential characteristics. The described embodiments are to be considered in all respects only as illustrated and not restrictive. The scope of the invention is, therefore, indicated by the appended claims and their whole or partial combination rather than by the foregoing description. All changes which come within the meaning and range of equivalency of the claims are to be embraced within their scope.

What is claimed and desired to be secured by United States Letters Patent is:

1. A method of fabricating a contact structure for an integrated circuit comprising:
    forming a lower bulk insulator layer upon a semiconductor substrate;
    forming a dielectric layer on the lower bulk insulator layer;
    forming a conductor layer upon the dielectric layer;
    forming a first insulator layer upon the conductor layer;
    forming a second insulator layer upon the first insulator layer, said second insulator layer having a top surface and having a thickness greater than that of the first insulator layer;
    selectively removing the first and second insulator layers so as to form a opening defined by the lower bulk insulator layer, the dielectric layer, the conductor layer, and the first and second insulator layers, the opening terminating at a bottom surface within the lower bulk insulator layer above the semiconductor substrate;
    forming a sleeve insulator layer upon the top surface of said second insulator layer and within said opening so as to make contact with each of the lower bulk insulator layer, the dielectric layer, the conductor layer, and the first and second insulator layers;
    removing the sleeve insulator layer from the bottom surface within the lower bulk insulator layer above the semiconductor substrate, from the top surface of the second insulator layer, and elsewhere such that the sleeve insulator layer has a terminus at an interface between the first and second insulator layers, and extends to an opposite terminus that is above the semiconductor substrate, within the lower bulk insulator layer, and below the dielectric layer; and
    removing material of the lower bulk insulator layer to expose a contact on the semiconductor substrate, and leaving the sleeve insulator layer in contact with each of the lower bulk insulator layer, the dielectric layer, the conductor layer, and the first and second insulator layers.

2. A method according to claim 1, wherein removing the sleeve insulator layer and removing material of the lower bulk insulator layer are etching processes.

3. A method according to claim 1, further comprising forming a conductive structure in contact with each of the sleeve insulator layer, the contact on the semiconductor substrate, and a sidewall of the lower bulk insulator layer that is situated in between the contact on the semiconductor substrate and the sleeve insulator layer.

4. A method according to claim 3, wherein the conductive structure has an end composed of a refractory metal silicide, said end of said conductive structure being situated upon the contact on the semiconductor substrate.

5. A method according to claim 3, wherein the conductive structure is composed of a material selected from the group consisting of tungsten, titanium/titanium nitride/tungsten, titanium/tungsten, aluminum, copper, a refractory metal silicide with aluminum, and a refractory metal silicide with copper.

6. A method as defined in claim 1, wherein said sleeve insulator layer is composed of material selected from the group consisting of $Ta_2O_5$ and $Si_3N_4$.

7. A method of fabricating a contact structure for an integrated circuit comprising:
    providing a semiconductor substrate having a capacitor storage node thereon and having an active region therein that is adjacent to a transistor on said semiconductor substrate;
    depositing a lower bulk insulator layer upon the active area, the transistor, and the semiconductor substrate;
    depositing a capacitor dielectric layer upon the lower bulk insulator layer and upon the capacitor storage node;
    depositing a cell plate conductor layer upon the capacitor dielectric layer;
    depositing a cell plate insulator layer upon the cell plate conductor layer;
    forming an upper bulk insulator layer upon the cell plate insulator layer, said upper bulk insulator layer having a top surface and a thickness that is greater than that of the cell plate insulator layer;
    etching a opening defined by the lower bulk insulator layer, the capacitor dielectric layer, the cell plate conductor layer, the cell plate insulator layer, and the upper bulk insulator layer, the opening terminating at a bottom surface within the lower bulk insulator layer above the semiconductor substrate;
    depositing a sleeve insulator layer upon the top surface of said upper bulk insulator layer and within said opening so as to make contact with each of the lower bulk insulator layer, the capacitor dielectric layer, the cell plate conductor layer, and the cell plate insulator layer;

etching the sleeve insulator layer from the bottom surface within the lower bulk insulator layer above the semiconductor substrate, from the top surface of the upper bulk insulator layer, and elsewhere such that the sleeve insulator layer has a terminus at an interface between the upper bulk insulator layer and the cell plate insulator layer, and extends to an opposite terminus that is above the semiconductor substrate, within the lower bulk insulator layer, and below the capacitor dielectric layer;

etching the lower bulk insulator layer selective to the sleeve insulator layer to expose the active region on the semiconductor substrate;

depositing a conductive plug in contact with each of the sleeve insulator layer, the active region on the semiconductor substrate, and a sidewall of the lower bulk insulator layer that is situated in between the contact on the semiconductor substrate and the sleeve insulator layer, wherein the conductive plug has an end composed of a refractory metal silicide, said end of said conductive plug being situated upon the contact on the semiconductor substrate.

8. A method of fabricating a contact structure for an integrated circuit comprising:

providing a semiconductor substrate having a capacitor storage node thereon;

forming a contact plug on the semiconductor substrate;

forming a lower bulk insulator layer upon the semiconductor substrate;

forming a capacitor dielectric layer upon the lower bulk insulator layer and upon the capacitor storage node;

forming a cell plate conductor layer upon the capacitor dielectric layer;

forming a cell plate insulator layer having a thickness upon the cell plate conductor layer;

forming an upper bulk insulator layer having a thickness upon the cell plate insulator layer, wherein said thickness of said upper bulk insulator layer is greater than that of the cell plate insulator layer, said upper bulk insulator layer having a top surface;

forming a opening defined by the lower bulk insulator layer, the capacitor dielectric layer, the cell plate conductor layer, the cell plate insulator layer, and the upper bulk insulator layer, the opening terminating at a bottom surface within the lower bulk insulator layer above the semiconductor substrate;

depositing a sleeve insulator layer upon the top surface of said upper bulk insulator layer and within said opening so as to make contact with each of the lower bulk insulator layer, the capacitor dielectric layer, the cell plate conductor layer, and the cell plate insulator layer;

etching the sleeve insulator layer from the bottom surface within the lower bulk insulator layer above the semiconductor substrate, from the top surface of the upper bulk insulator layer, and elsewhere such that the sleeve insulator layer has a terminus at an interface between the upper bulk insulator layer and the cell plate insulator layer, and extends to an opposite terminus that is above the semiconductor substrate, within the lower bulk insulator layer, and below the capacitor dielectric layer;

etching the lower bulk insulator layer to expose the contact plug on the semiconductor substrate, and leaving the sleeve insulator layer in contact with each of the lower bulk insulator layer, the capacitor dielectric layer, the cell plate conductor layer, and the cell plate insulator layer;

depositing an electrically conductive bit line contact extending from the sleeve insulator layer to terminate at the contact plug, the contact plug extending from the electrically conductive bit line contact to the contact on said semiconductor substrate, wherein the electrically conductive bit line is in contact with the sleeve insulator layer and a sidewall of the lower bulk insulator layer that is situated in between the contact plug and the sleeve insulator layer.

9. A method of fabricating a contact structure for an integrated circuit comprising:

providing a semiconductor substrate having thereon a capacitor storage node;

forming a transistor on the semiconductor substrate, the transistor having a gate electrode;

forming a lower bulk insulator layer upon the semiconductor substrate and upon the transistor;

forming a capacitor dielectric layer upon the lower bulk insulator layer and upon the capacitor storage node;

forming a cell plate conductor layer upon the capacitor dielectric layer;

forming a cell plate insulator layer upon the cell plate conductor layer;

forming an upper bulk insulator layer upon the cell plate insulator layer, said cell plate insulator layer having a thickness that is less than that of the upper bulk insulator layer, said upper bulk insulator layer having a top surface;

forming a opening defined by the lower bulk insulator layer, the capacitor dielectric layer, the cell plate conductor layer, the cell plate insulator layer, and the upper bulk insulator layer, the opening terminating at a bottom surface within the lower bulk insulator layer above the semiconductor substrate;

depositing a sleeve insulator layer upon the top surface of said upper bulk insulator layer and within said opening so as to make contact with each of the lower bulk insulator layer, the capacitor dielectric layer, the cell plate conductor layer, and the cell plate insulator layer;

etching the sleeve insulator layer from the bottom surface within the lower bulk insulator layer above the semiconductor substrate, from the top surface of the upper bulk insulator layer, and elsewhere such that the sleeve insulator layer has a terminus at an interface between the upper bulk insulator layer and the cell plate insulator layer, and extends to an opposite terminus that is above the semiconductor substrate, within the lower bulk insulator layer, and below the capacitor dielectric layer;

etching the lower bulk insulator layer and the transistor to expose the gate electrode, and leaving the sleeve insulator layer in contact with each of the lower bulk insulator layer, the capacitor dielectric layer, the cell plate conductor layer, and the cell plate insulator layer;

depositing an electrically conductive bit line contact extending from the sleeve insulator layer to terminate at the gate electrode, wherein the electrically conductive bit line is in contact with the sleeve insulator layer and a sidewall of the lower bulk insulator layer that is situated in between the gate electrode and the sleeve insulator layer.

10. A method of fabricating a contact structure for an integrated circuit comprising:

forming a lower bulk insulator layer and a capacitor storage node upon a semiconductor substrate;

forming a capacitor dielectric layer upon the lower bulk insulator layer on the capacitor storage node;

forming a cell plate conductor layer upon the capacitor dielectric layer;

forming a cell plate insulator layer upon the cell plate conductor layer;

forming an upper bulk insulator layer upon the cell plate insulator layer, said upper bulk insulator layer having a top surface and a thickness that is greater than that of said cell plate insulator layer;

selectively removing each of the upper bulk insulator layer, the lower bulk insulator layer, the capacitor dielectric layer, the cell plate conductor layer, and the cell plate insulator layer to define an opening that terminates at a bottom surface within the lower bulk insulator layer above the semiconductor substrate;

forming a sleeve insulator layer upon the top surface of said upper bulk insulator layer and within said opening so as to make contact with each of the lower bulk insulator layer, the capacitor dielectric layer, the cell plate conductor layer, and the cell plate insulator layer;

selectively removing the sleeve insulator layer to have a terminus at an interface between the upper bulk insulator layer and the cell plate insulator layer, and an extension to an opposite terminus that is above the semiconductor substrate, within the lower bulk insulator layer, and below the capacitor dielectric layer; and removing material of the lower bulk insulator layer to expose a contact on the semiconductor substrate, and leaving the sleeve insulator layer in contact with each of the lower bulk insulator layer, the capacitor dielectric layer, the cell plate conductor layer, and the cell plate insulator layer.

11. A method of fabricating a contact structure for an integrated circuit comprising:

forming a lower bulk insulator layer and a capacitor storage node upon a semiconductor substrate;

forming a capacitor dielectric layer upon the capacitor storage node;

forming a cell plate conductor layer upon the capacitor storage node and above the lower bulk insulator layer;

forming a cell plate insulator layer upon the cell plate conductor layer;

forming an upper bulk insulator layer upon the cell plate insulator layer, the upper bulk insulator layer having a top surface and a thickness that is greater than that of the cell plate insulator layer;

forming an opening that is defined by each of the lower bulk insulator layer, the capacitor dielectric layer, the cell plate conductor layer, the cell plate insulator layer, and the upper bulk insulator layer, the opening extending towards the semiconductor substrate and terminating at a bottom surface within the lower bulk insulator layer above the semiconductor substrate;

forming a sleeve insulator layer upon said upper bulk insulator layer and within said opening so as to making contact with each of the lower bulk insulator layer, the cell plate conductor layer, and the cell plate insulator layer;

selectively removing the sleeve insulator layer so as to have a terminus at an interface between the upper bulk insulator layer and the cell plate insulator layer and an extension to an opposite terminus that is within the lower bulk insulator layer and above the semiconductor substrate; and removing the lower bulk insulator layer from the bottom surface within the lower bulk insulator layer above the semiconductor substrate to expose a contact on the semiconductor substrate, and leaving the sleeve insulator layer in contact with each of the lower bulk insulator layer, the cell plate conductor layer, and the cell plate insulator layer.

12. A method according to claim 11, further comprising forming a conductive plug in contact with each of the sleeve insulator layer, the contact on the semiconductor substrate, and a sidewall of the lower bulk insulator layer that is situated in between the contact on the semiconductor substrate and the sleeve insulator layer.

13. A method of fabricating a contact structure for an integrated circuit comprising:

forming a lower bulk insulator layer and a capacitor storage node upon a semiconductor substrate;

forming a capacitor dielectric layer upon the capacitor storage node and upon the lower bulk insulator layer;

forming a cell plate conductor layer upon the capacitor dielectric layer;

forming a cell plate insulator layer upon the cell plate conductor layer:

forming an upper bulk insulator layer upon the cell plate insulator layer, wherein the thickness of the upper bulk insulator layer is greater than that of the cell plate insulator layer;

selectively removing each of the upper bulk insulator layer, the cell plate insulator layer, the cell plate conductor layer, the capacitor dielectric layer, and the lower bulk insulator layer so as to form a opening terminating at a bottom surface within the lower bulk insulator layer above the semiconductor substrate;

depositing a sleeve insulator layer upon said upper bulk insulator layer and within said opening so as to make contact with each of the lower bulk insulator layer, the capacitor dielectric layer, the cell plate conductor layer, and the cell plate insulator layer;

selectively removing the sleeve insulator layer such that a remaining portion thereof extends from a terminus at an interface between the upper bulk insulator layer and the cell plate insulator layer to an opposite terminus within the lower bulk insulator layer and above the semiconductor substrate;

selectively removing the lower bulk insulator layer to create a contact hole defined by the sleeve insulator layer and the lower bulk insulator layer and to expose a contact on the semiconductor substrate; and forming a conductive plug in the contact hole upon the contact on the semiconductor substrate, said sleeve insulator layer electrically insulating the conductive plug from the cell plate conductor layer.

14. A method of fabricating a contact structure for an integrated circuit comprising:

forming a lower bulk insulator layer and a capacitor storage node upon a semiconductor substrate;

forming a capacitor dielectric layer upon the capacitor storage node and upon the lower bulk insulator layer;

forming a cell plate conductor layer upon the capacitor dielectric layer;

forming a cell plate insulator layer upon the cell plate conductor layer;

forming an upper bulk insulator layer upon the cell plate insulator layer;

selectively removing each of the upper bulk insulator layer, the cell plate insulator layer, the lower bulk insulator layer, the capacitor dielectric layer, and the cell plate conductor layer to define an opening terminating at a bottom surface within the lower bulk insulator layer above the semiconductor substrate;

depositing a sleeve insulator layer upon said upper bulk insulator layer and within said opening so as to make contact with each of the lower bulk insulator layer, the capacitor dielectric layer, the cell plate conductor layer, and the cell plate insulator layer;

selectively removing the sleeve insulator layer such that a remaining portion thereof extends from a terminus at an interface between the upper bulk insulator layer and the cell plate insulator layer to an opposite terminus that is within the lower bulk insulator layer and above the semiconductor substrate;

selectively removing material from the lower bulk insulator layer to create a contact hole extending from the upper bulk insulator layer through the sleeve insulator layer and the lower bulk insulator layer to expose a contact on the semiconductor substrate; and forming a conductive plug in the contact hole upon the contact on the semiconductor substrate and extending to the upper bulk insulator layer, said sleeve insulator layer electrically insulating the conductive plug from the cell plate conductor layer.

15. A method of fabricating a contact structure for an integrated circuit comprising:

providing a semiconductor substrate having an active region therein;

forming a capacitor storage node upon the active region;

forming a capacitor dielectric layer upon the capacitor storage node;

forming a cell plate conductor layer upon the capacitor dielectric layer;

forming a cell plate insulator layer upon the cell plate conductor layer;

forming a upper bulk insulator layer upon the cell plate insulator layer, wherein the upper bulk insulator layer is greater in thickness than the cell plate insulator layer;

forming a contact hole extending through the upper bulk insulator layer, the cell plate insulator layer, the cell plate conductor layer, the capacitor dielectric layer, and the capacitor storage node to terminate at the active region;

forming a sleeve insulator layer within the contact hole, the sleeve insulator layer extending from a terminus at an interface between the upper bulk insulator layer and the cell plate insulator layer and an opposite terminus that is below the capacitor dielectric layer and above the semiconductor substrate;

forming an electrically conductive plug extending through the sleeve insulator layer to make contact with the active region and the capacitor storage node, the electrically conductive plug being electrically insulated from the cell plate conductor layer by the sleeve insulator layer.

16. The method as defined in claim 15, further comprising, prior to forming said electrically conductive plug:

forming a first transistor upon the semiconductor substrate;

forming a second transistor upon the semiconductor substrate, and wherein forming said electrically conductive plug further comprises forming a first portion of the electrically conductive plug so as to be is situated between the first and second transistors and between the semiconductor substrate and the sleeve insulator layer.

17. The method as defined in claim 16, wherein the first portion of the electrically conductive plug is enclosed within the sleeve insulator layer.

18. The method as defined in claim 7, further comprising:

forming an electrically conductive bit line in contact with said conductive plug.

19. The method as defined in claim 7, wherein the conductive plug is at least partially circumscribed by and is in contact with said sleeve insulator layer.

20. The method as defined in claim 7, wherein said sleeve insulator layer is composed of material selected from the group consisting of $Ta_2O_5$ and $Si_3N_4$.

21. The method as defined in claim 11, further comprising:

forming an electrically conductive plug upon the contact and extending through the sleeve insulator layer.

22. The method as defined in claim 11, wherein the opposite terminus of the sleeve insulator layer is between the cell dielectric layer and the semiconductor substrate.

23. The method as defined in claim 11, further comprising:

forming an electrically conductive bit line in contact with said electrically conductive plug.

24. The method as defined in claim 21, wherein the electrically conductive plug is at least partially circumscribed by and is in contact with said sleeve insulator layer.

25. The method as defined in claim 11, wherein said sleeve insulator layer is composed of material selected from the group consisting of $Ta_2O_5$ and $Si_3N_4$.

26. The method as defined in claim 13, wherein the electrically conductive plug is at least partially circumscribed by and is in contact with said sleeve insulator layer.

27. The method as defined in claim 13, wherein said sleeve insulator layer is composed of material selected from the group consisting of $Ta_2O_5$ and $Si_3N_4$.

28. The method as defined in claim 13, further comprising:

forming an electrically conductive bit line in contact with said electrically conductive plug.

29. The method as defined in claim 13, wherein the opposite terminus of the sleeve insulator layer is between the cell dielectric layer and the semiconductor substrate.

30. The method as defined in claim 14, wherein the conductive plug is at least partially circumscribed by and is in contact with said sleeve insulator layer.

31. The method as defined in claim 14, wherein said sleeve insulator layer is composed of material selected from the group consisting of $Ta_2O_5$ and $Si_3N_4$.

32. The method as defined in claim 14, further comprising:

forming an electrically conductive bit line in contact with said conductive plug.

33. The method as defined in claim 14, wherein the opposite terminus of the sleeve insulator layer is between the cell dielectric layer and the semiconductor substrate.

34. The method as defined in claim 15, wherein the electrically conductive plug is at least partially circumscribed by and is in contact with said sleeve insulator layer.

35. The method as defined in claim 15, wherein said sleeve insulator layer is composed of material selected from the group consisting of $Ta_2O_5$ and $Si_3N_4$.

36. The method as defined in claim 15, further comprising:
   forming an electrically conductive bit line in contact with said electrically conductive plug.

37. A method of fabricating an integrated circuit that includes a semiconductor substrate having an active region therein, a capacitor storage node upon the active region, a capacitor dielectric layer upon the capacitor storage node, a cell plate conductor layer upon the capacitor dielectric layer, and a cell plate insulator layer upon the cell plate conductor layer, the method comprising:
   forming a upper bulk insulator layer upon the cell plate insulator layer, wherein the upper bulk insulator layer is greater in thickness than the cell plate insulator layer;
   forming a contact hole extending through the upper bulk insulator layer, the cell plate insulator layer, the cell plate conductor layer, the capacitor dielectric layer, and the capacitor storage node to terminate at the active region;
   forming a sleeve insulator layer within the contact hole, the sleeve insulator layer extending from a terminus at an interface between the upper bulk insulator layer and the cell plate insulator layer and an opposite terminus that is below the capacitor dielectric layer and above the semiconductor substrate;
   forming an electrically conductive plug extending through the sleeve insulator layer to make contact with the active region and the capacitor storage node, the electrically conductive plug being electrically insulated from the cell plate conductor layer by the sleeve insulator layer.

38. A method according to claim 10, wherein selectively removing the sleeve insulator layer and removing material of the lower bulk insulator layer are etching processes.

39. A method according to claim 10, further comprising forming a conductive plug in contact with each of the sleeve insulator layer, the contact on the semiconductor substrate, and a sidewall of the lower bulk insulator layer that is situated in between the contact on the semiconductor substrate and the sleeve insulator layer.

40. A method according to claim 39, wherein the conductive plug has an end composed of a refractory metal silicide, said end of said conductive plug being situated upon the contact on the semiconductor substrate.

41. A method as defined in claim 10, wherein said sleeve insulator layer is composed of material selected from the group consisting of $Ta_2O_5$ and $Si_3N_4$.

42. A method as defined in claim 39, wherein said conductive plug comprises:
   a electrically conductive bit line contact extending from the sleeve insulator layer to terminate at a contact plug, the contact plug extending from the electrically conductive bit line contact to the contact on said semiconductor substrate.

43. A method according to claim 39, wherein the conductive plug is composed of an electrically conductive material selected from the group consisting of tungsten, titanium/titanium nitride/tungsten, titanium/tungsten, aluminum, copper, a refractory metal silicide with aluminum, and a refractory metal silicide with copper.

* * * * *

UNITED STATES PATENT AND TRADEMARK OFFICE
CERTIFICATE OF CORRECTION

PATENT NO.    : 6,348,411 B1                                               Page 1 of 1
DATED         : February 19, 2002
INVENTOR(S)   : Philip J. Ireland and Howard E. Rhodes It is certified that error appears in the above-identified patent and that said Letters Patent is hereby corrected as shown below:

Column 1,
Line 44, after "large" change "extend" to -- extent --
Line 44, after "Volume" insert -- 56 --
Line 51, before "planarizing" change "an" to -- a --

Column 5,
Line 18, after "first" change "etches" to -- etch --
Line 18, after "step" change "etching" to -- etches --
Line 32, after "can" and before "performed" insert -- be --

Column 6,
Line 17, after "upon" change "a" to -- an --
Line 44, after "deposited" insert -- upon --
Line 44, before "upper" change "a" to -- an --

Column 7,
Line 35, after "however" change "maybe" to -- may be --
Line 54, before "the misalignment" change "represent" to -- represents --

Column 8,
Line 47, after "bit line" delete "8"

Column 16,
Line 3, after "as to be" delete "is"
Line 25, after "claim" change "11" to -- 21 --

Signed and Sealed this

Twenty-second Day of October, 2002

Attest:

Attesting Officer

JAMES E. ROGAN
Director of the United States Patent and Trademark Office